(12) United States Patent
Tamarkin

(10) Patent No.: US 6,540,527 B1
(45) Date of Patent: Apr. 1, 2003

(54) METHOD AND ADAPTER FOR REWORKING A CIRCUIT CONTAINING AN LGA DEVICE

(75) Inventor: Vladimir K. Tamarkin, Huntingdon Valley, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/561,401

(22) Filed: Apr. 28, 2000

(51) Int. Cl.⁷ .............................................. H01R 12/00
(52) U.S. Cl. ......................................... 439/67; 439/957
(58) Field of Search .............................. 439/67, 77, 74, 439/957; 216/52

(56) References Cited

U.S. PATENT DOCUMENTS

| | | | |
|---|---|---|---|
| 4,249,302 A | * | 2/1981 | Crepeau ..................... 29/830 |
| 4,438,561 A | | 3/1984 | Mueller |
| 4,519,658 A | * | 5/1985 | Biswas |
| 4,554,505 A | | 11/1985 | Zachry |
| 4,803,595 A | | 2/1989 | Kraus et al. |
| 4,872,843 A | | 10/1989 | Anstey |
| 4,912,401 A | | 3/1990 | Nady, II et al. |
| 4,991,290 A | * | 2/1991 | Mackay ...................... 439/67 |
| 5,092,788 A | | 3/1992 | Pristupa, Jr. et al. |
| 5,147,209 A | | 9/1992 | Litwin et al. |
| 5,176,524 A | | 1/1993 | Mizuno et al. |
| 5,177,594 A | | 1/1993 | Chance et al. |
| 5,205,741 A | | 4/1993 | Steen et al. |
| 5,237,131 A | | 8/1993 | Catlin |
| 5,258,648 A | * | 11/1993 | Lin ............................. 361/725 |
| 5,276,817 A | | 1/1994 | Matschke et al. |
| 5,383,787 A | | 1/1995 | Switky et al. |
| 5,384,955 A | | 1/1995 | Booth et al. |
| 5,460,531 A | | 10/1995 | Vivio |
| 5,468,157 A | | 11/1995 | Roebuck et al. |
| 5,683,256 A | | 11/1997 | Werther |
| 5,691,041 A | * | 11/1997 | Frankeny et al. ............. 439/74 |
| 5,727,955 A | | 3/1998 | Tsubakihara |
| 5,743,748 A | | 4/1998 | Takahata et al. |
| 5,806,181 A | | 9/1998 | Khandros et al. |
| 5,809,641 A | | 9/1998 | Crudo et al. |
| 5,834,335 A | | 11/1998 | Buschbom |
| 5,883,788 A | | 3/1999 | Ondricek et al. |
| 5,890,284 A | | 4/1999 | Chartrand et al. |
| 5,903,162 A | | 5/1999 | Cole et al. |
| 6,428,327 B1 | * | 8/2002 | Tamarkin et al. ............. 439/67 |

* cited by examiner

*Primary Examiner*—Neil Abrams
(74) *Attorney, Agent, or Firm*—RatnerPrestia; Lise A. Rode; Mark T. Starr

(57) ABSTRACT

This invention provides a method for producing an adapter for use with an LGA device. The method includes providing a flexible substrate having a conductive base layer. The method also includes forming a plurality of openings through the flexible substrate. The method further includes defining on the flexible substrate a plurality of vias extending through the openings in the flexible substrate, a plurality of conductive pads electrically connected to the vias, and a plurality of conductive paths extending between adjacent pads, wherein spaces are defined between the pads and the paths to prevent direct contact between the pads and the paths, each of the paths being connected to at least one of a plurality of peripheral pads provided on the flexible substrate. The conductive base layer substantially covers a portion of the substrate surface area. A portion of the base layer may be removed such that remaining portions form conductive branch traces used to connect selected conductive pads with selected conductive paths.

12 Claims, 7 Drawing Sheets

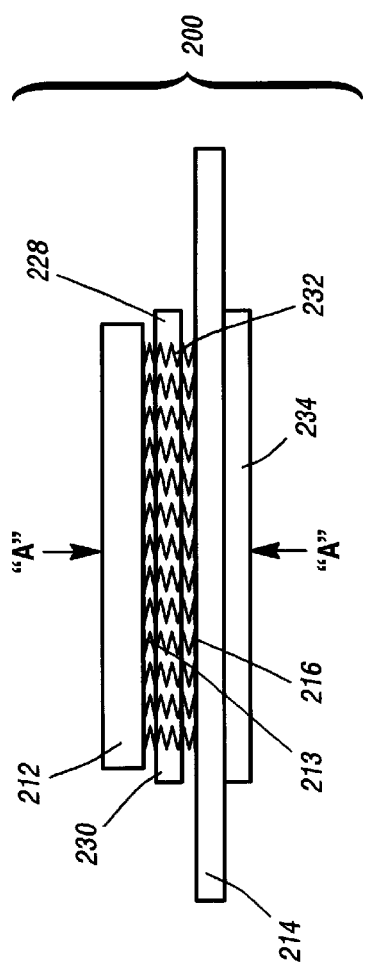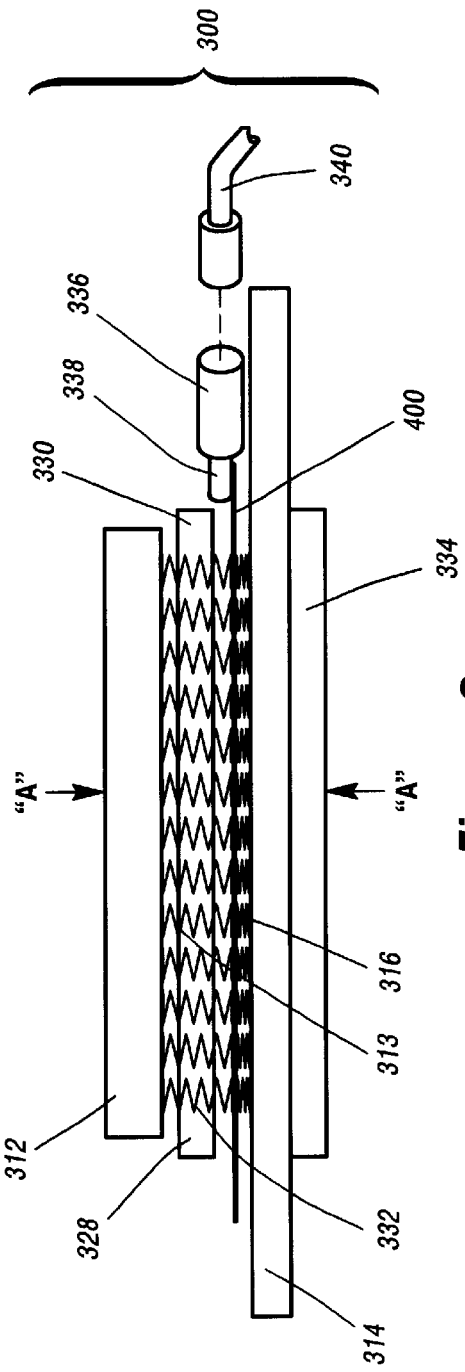

METHOD AND ADAPTER FOR REWORKING A CIRCUIT CONTAINING AN LGA DEVICE

FIELD OF THE INVENTION

This invention relates to a method and apparatus for reworking an electronic circuit on a printed circuit board. More particularly, this invention relates to a method for producing an adapter for use with an LGA device, a rework adapter for use with an LGA device, and a method for reworking a circuit containing an LGA device to provide a desired circuit.

BACKGROUND OF THE INVENTION

Manufacturers that are involved in the design and fabrication of printed circuit boards may, under some circumstances, find it necessary to modify newly designed printed circuit boards in order to implement engineering improvements. Over the years, various rework techniques have been proposed for use with printed circuit boards.

These proposed techniques are often specialized in that they are suited for use with particular types of printed circuit boards and circuit board components. Accordingly, some of the techniques proposed in the past are appropriate for use with certain component types but may be ineffective for use with other types of components.

For example, referring generally to FIGS. 1 and 2, an exemplary printed circuit board modification procedure will now be described. Referring first to FIG. 1, a circuit board assembly 10 includes an electronic device 12 mounted to a circuit board 14. Circuit board 14 includes a plurality of pads 16, and surface traces connect the pads 16 to a plurality of vias 18. Electronic device 12 is provided with a plurality of pins or leads 28, which provide for electrical coupling with selected pads 16 on the circuit board 14.

A modification can be made to such a printed circuit board in two stages. The first stage can be considered "pin isolation," wherein a pin of an electronic device is isolated from a circuit on the printed circuit board. This stage is illustrated in FIG. 1, wherein a surface trace cut isolates a surface mount pad from a via hole that is connected to the rest of the circuit. More specifically, a surface trace cut 20 is made in order to isolate a surface mount pad 16 from a via 18. The surface trace cut 20 therefore provides an accessible connection 22 to which a modification can be made (as shown in FIG. 2). A surface trace cut 24, however, is hidden beneath electronic device 12. Accordingly, surface trace cut 24 provides an inaccessible connection 26.

Referring now to FIG. 2, the second stage is illustrated. In this stage, which can be considered a "circuit re-connection" stage, a pin of an electronic device is connected to another circuit using a wire. Specifically, a wire 30 is connected to a pin or lead 28 of electronic device 12 by means of a soldered connection 32. An opposite end 34 of wire 30 is provided for connection to an external circuit. Similarly, a second wire 36 is connected to another pin or lead of electronic device 12 at a soldered connection 38. An opposite end of wire 36 is provided with an end 40 for connection to an external circuit.

Pin isolation for an electronic device such as device 12 is usually a straight forward procedure and the manner in which circuit re-connection is made depends primarily on the accessibility of the surface trace being cut or on the accessibility of the pin that is to be isolated. For example, if a trace is not readily accessible (e.g., for making the surface trace cut 24 illustrated in FIG. 1), then an electronic device such as device 12 is first removed from the printed circuit board so that the trace can be accessed, and the device can be subsequently reinstalled. Nevertheless, an inaccessible connection such as connection 26 can be overcome by connecting a wire directly to the exposed lead of the device such as at soldered connection 38.

It will be appreciated, therefore, that the modification procedure illustrated in FIGS. 1 and 2 is suitable for use with devices such as device 12 that have pin-type leads, but that the modification will not be adequate for use with electronic devices of the type where the pins or leads of the device are not accessible. Accordingly, there remains a need for an adapter and method for use with electronic devices which have leads that are not easily accessible. More specifically, there remains a need for an adapter and method that can be used with land grid array (LGA) devices.

An LGA adapter should be fabricated and prepared for use easily, quickly and with standard laboratory equipment. Accordingly, there remains a need for an improved method for producing an adapter for use with an LGA device, an approved rework adapter for use with an LGA device, and an improved method for reworking a circuit containing an LGA device to provide a desired circuit.

SUMMARY OF THE INVENTION

This invention provides a method for producing an adapter for use with an LGA device. The method includes providing a flexible substrate having a conductive base layer. The method also includes forming a plurality of vias extending through openings defined in the flexible substrate, defining on the flexible substrate a plurality of conductive pads electrically connected to the vias, and further defining on the flexible substrate a plurality of conductive paths extending between adjacent conductive pads. Spaces are defined between the conductive pads and the conductive paths to prevent direct contact between the conductive pads and the conductive paths. The method further includes the step of retaining the conductive base layer, thereby maintaining electrical contact between the conductive pads and the conductive paths.

This invention also provides an adapter for use with an LGA device. The adapter includes a flexible substrate having a conductive base layer. Vias extend through openings defined in the flexible substrate. The adapter also includes conductive pads electrically connected to the vias. The conductive paths of the adapter extend between adjacent conductive pads. Spaces are defined between the conductive paths and the conductive pads to prevent direct contact between the conductive pads and the conductive paths. The conductive base layer maintains electrical contact between the conductive pads and the conductive paths.

This invention further provides a method for reworking a circuit containing an LGA device to provide a desired circuit. The method includes providing an adapter including a flexible substrate having a conductive base layer, vias extending through openings defined in the flexible substrate, conductive pads electrically connected to the vias, and conductive paths extending between adjacent conductive pads, spaces being defined between the conductive paths and the conductive pads to prevent direct contact between the conductive pads and the conductive paths. The conductive base layer maintains electrical contact between the conductive pads and the conductive paths. The method also includes the step of selecting a desire circuit. Further included in the method is the step of removing a portion of the conductive base layer from the flexible substrate such that the remaining portion of the conductive base layer, together with selected ones of the conductive pads and the conductive paths, defines the desired circuit.

BRIEF DESCRIPTION OF THE DRAWINGS

Exemplary embodiments of this invention will now be described with reference to the drawings, of which:

FIG. 5 is a side view of an embodiment of a circuit board assembly including a land grid array (LGA) device and an interposer socket;

FIG. 6 is a side view of an exemplary embodiment of a circuit board assembly including an adapter according to aspects of this invention;

DETAILED DESCRIPTION OF THE INVENTION

Figure 1:
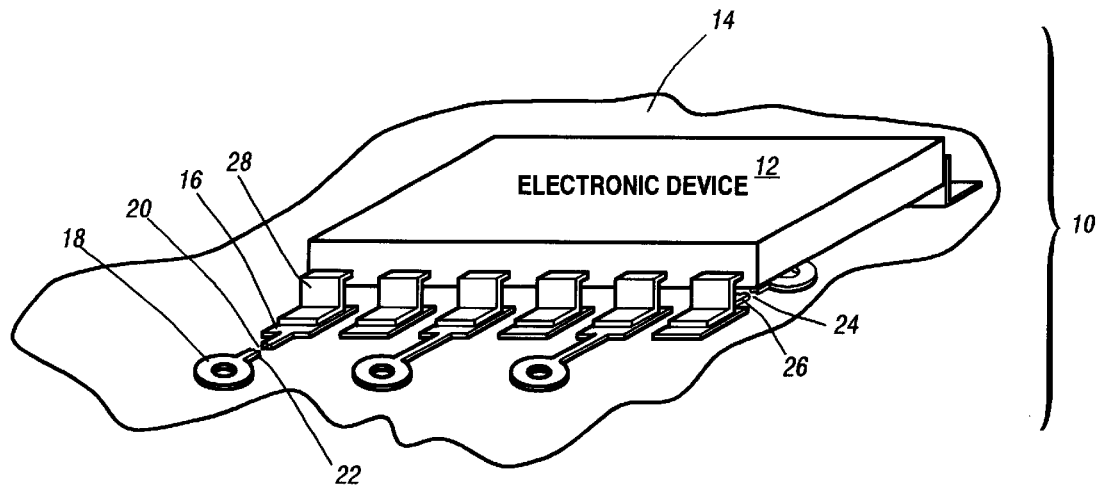
FIG. 1 is a perspective view of a circuit board assembly for illustrating pin isolation.
Figure 2:
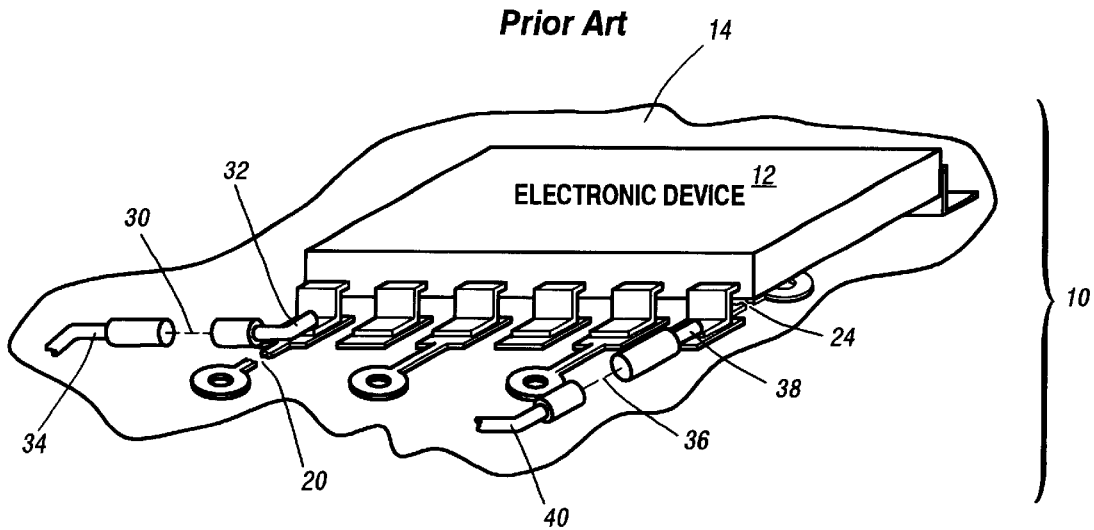
FIG. 2 is a perspective view of the circuit board assembly illustrated in FIG. 1, for illustrating circuit re-connection.

This invention will now be described with reference to specific embodiments selected for illustration in the drawings. It will be appreciated that the spirit and scope of this invention is not limited to the embodiments selected for illustration. Instead, the scope of this invention is defined separately in the appended claims. Also, it will be appreciated that the drawings are not rendered to any particular proportion or scale.

According to a preferred aspect of this invention, an adapter and method are provided for modifying printed circuit boards having land grid array (LGA) devices. More specifically, this invention relates to the modification or repair of circuit boards on which LGA devices are mounted and an interposer socket having compliant contacts is used to bring about electrical coupling between LGA pads and circuit board pads. In order to maintain electrical coupling in such an assembly, pressure is applied by mechanical fasteners between the LGA device and a back-up plate positioned on the side of the circuit board opposite that of the LGA device. Although the invention is described with reference to LGA devices, it is contemplated that the adapter and method of this invention can be used in connection with other electronic components as well.

An exemplary adapter is a flex circuit having an array of plated vias with a pad on each side. In order to form a modified electrical connection in a circuit board assembly, the adapter can be provided with a copper trace that is routed to a periphery pad to which an electrical connection can be made (e.g., by means of a wire soldered to the periphery pad). An example of such an adapter is illustrated and described in application Ser. No. 09/418,665, field Oct. 14, 1999, which application is incorporated herein by reference in its entirety. The flex circuit or substrate of the adapter is sufficiently flexible so that the force of the compliant contacts (or springs) of an interposer socket is transferred through the adapter to the circuit board when the adapter is positioned between the interposer socket and the circuit board. The flex circuit or substrate of the adapter is also sufficiently flexible so that the force of the compliant contacts is transferred through the adapter to an LGA device when the adapter is positioned between the interposer socket and an LGA device.

In other words, the flex circuit of the adapter should have flexibility sufficient to conform the lands or pads of the adapter to the lands or pads of the circuit board or LGA device under the influence of the compliant contacts of the interposer socket. Most preferably, the flex circuit of the adapter is made of polymeric film as opposed to the glass fiber-reinforced materials used to form printed circuit boards.

Such an adapter as the one described in application Ser. No. 09/418,665 overcomes the disadvantages associated with conventional circuit board rework methods. For example, when LGA devices are mounted on a circuit board, a via can be partially drilled out from the opposite side of the circuit board in order to break internal circuit connections. An insulated wire can then be attached to a surface trace, on the facing surface of the circuit board, that is still connected to a surface mount pad. However, the solder and the tip of the wire extending through the circuit board often interfere with the interposer socket, and the wire (which would extend outwardly from the opposite surface of the circuit board) can also interfere with the pressure back plate of the assembly. Furthermore, the relationship between the interposer socket contacts and the lands or pads is changed and a great deal of labor is required. Accordingly, the adapter and method of this invention reduces labor costs and improves product quality.

Figure 3:
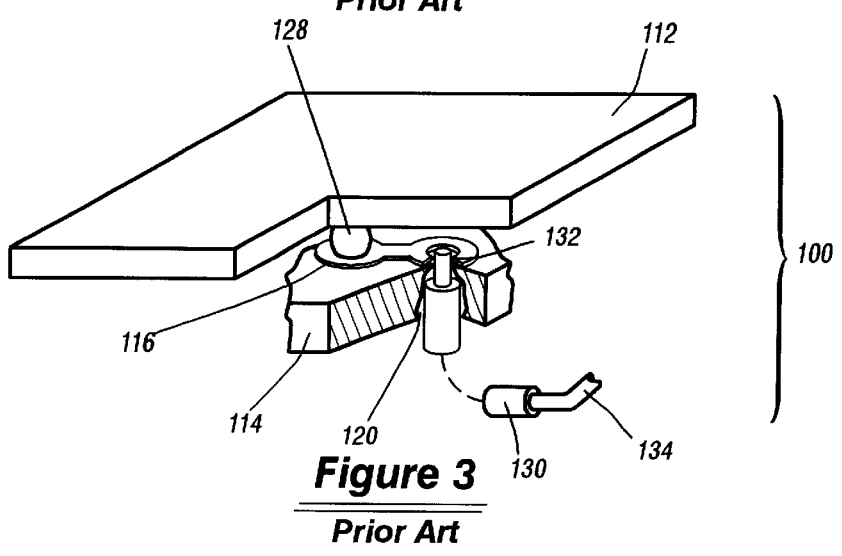
FIG. 3 is a perspective view of a circuit board assembly including a ball grid array (BGA) device.

For example, referring to FIG. 3, a modification procedure suitable for use with a ball grid array (BGA) device is illustrated. More specifically, a printed circuit board assembly 100 is provided with a BGA device 112 mounted to a circuit board 114. BGA device 112 includes a plurality of balls 128 (only one shown) that are soldered to surface pads such as surface pad 116 on circuit board 114. As is illustrated in FIG. 3, the circuit board 114 is drilled out at 120 (after BGA device is removed) from a bottom surface in order to sever internal connections to a via. An insulated wire such as wire 130 is then soldered to a via pad 132 for electrical connection to a surface trace that is in turn connected to surface pad 116. The BGA device is then reinstalled on circuit board 114. The wire 130 is provided with an end 134 for connection to an external circuit. It has been discovered that this modification procedure can be tedious and require significant operator skill.

Figure 4:
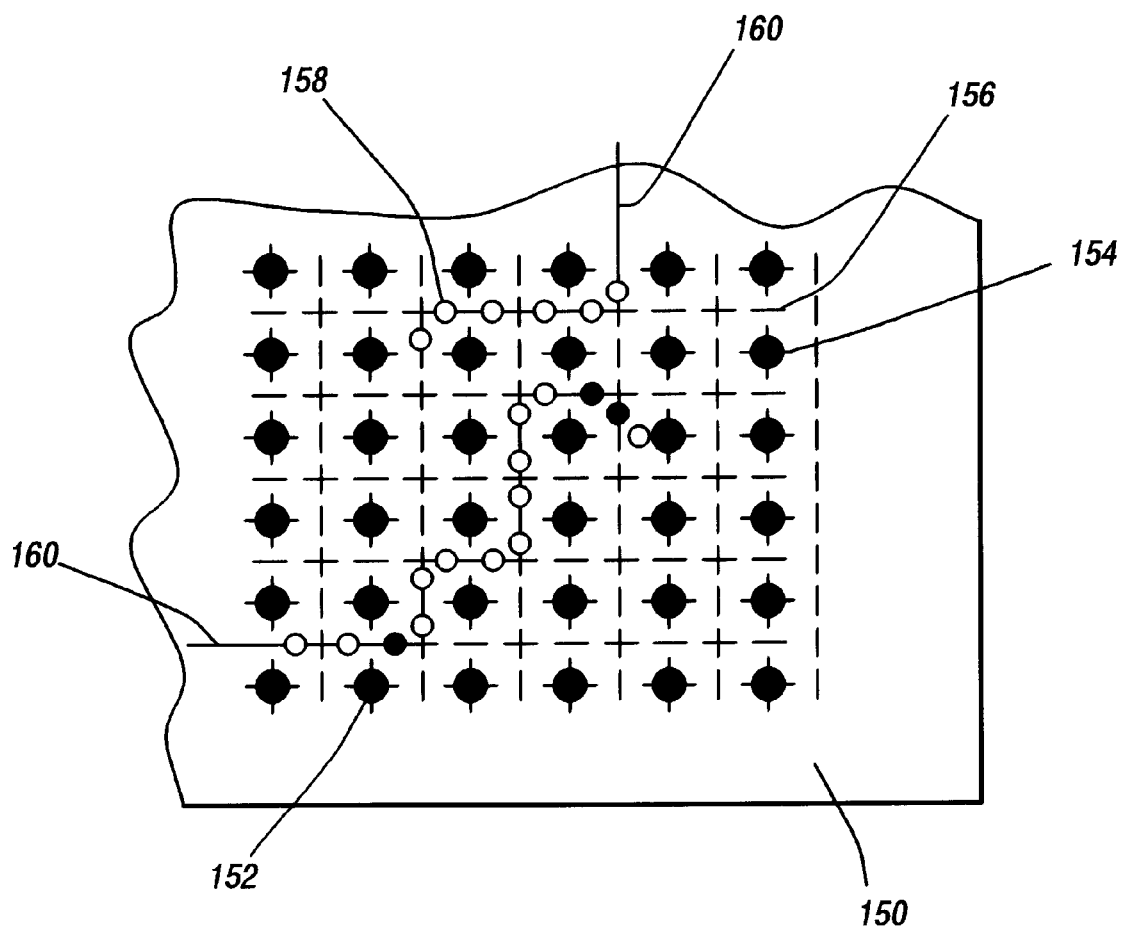
FIG. 4. is a top view of an adapter for use with a ball grid array (BGA) device

Referring now to FIG. 4, another modification procedure suitable for use with a BGA device is illustrated. More specifically, a BGA rework adapter 150 can be utilized as a "quick change" adapter. BGA rework adapter 150 included a series of copper pads which are arranged in a corresponding BGA format. A number (four (4) illustrated) of copper spokes 154 extend outwardly from each pad 152 toward a network of surface traces 156 and vias, which are positioned between the pads 152. Additional, periphery pads (not shown) are accessible for the connection of wires. Initially, the BGA pads 152, vias, traces 156 and periphery pads are disconnected from each other. However, progressively soldering the ends of these conductive features, by means of solder connects 158, forms a circuit or connected path 160 to connect a selected BGA pad 152 to a periphery pad. In this manner, a generic adapter, with network features unconnected, can be designed and manufactured ahead of time. A progressive soldering operation can then be performed in the engineering laboratory as required.

It has been discovered that the procedures illustrated in FIGS. 3 and 4 are not always appropriate for modification of a printed circuit board assembly including an LGA device— LGA devices present a unique set of challenges. For example, LGA devices (such as the one illustrated in FIG. 5) are not soldered to a board in the manner in which BGA devices are mounted. Instead, a land grid connector in the form of an interposer socket is used to make electrical connections between the pads or lands on the LGA device and corresponding pads on the printed circuit board. Compliant contacts such as springs are provided on the interposer socket for electric coupling between the LGA device and the circuit board. Pressure is applied between the LGA device and the printed circuit board (by means of a back-up plate and mechanical fasteners) in order to compress the interposer socket between the device and the board so as to establish an electrical path between the corresponding pads.

Referring now to FIG. 5, for example, a circuit board assembly 200 includes an LGA device 212 that is mounted to a circuit board 214. The LGA device 212 includes LGA pads 213, and the circuit board 214 includes circuit board pads 216. An interposer socket 228 is interposed between LGA device 212 and circuit board 214. Interposer socket 228 includes a socket body 230 and a plurality of compliant contacts in the form of conductive springs 232. The compliant contacts 232 provide for electrical coupling between the LGA pads 213 on the LGA device 212 and the circuit board pads 216 on the circuit board 214.

A back-up plate 234 is also provided for mechanical connection, and pressure indicated by the letters "A" in FIG. 5 is applied to urge the LGA device 212 and the circuit board 214 toward one another. Mechanical fasteners such as bolts, screws and other known fasteners (not shown) are used to couple the LGA device 212 to the back-up plate 234 in order to generate such pressure. Accordingly, electrical coupling is maintained between the LGA device 212 and the circuit board 214 by means of compliant contacts 232.

A pin isolation technique used for LGA devices can be the same as that used for BGA devices as shown in FIG. 3. However, if re-connection of leads of the LGA device is required, a wire such as wire 130 attached as shown in FIG. 3 may interfere with an interposer socket. Such interference may be the result of the solder connection between the end of the wire and the via pad, which will be adjacent to the surface of the circuit board with which the compliant contacts of the interposer socket come in contact. Also, wires attached as shown in FIG. 3 may interfere with back-up hardware such as back-up plate 234 shown in FIG. 5. Accordingly, the connection of a wire as shown in FIG. 3 can, in some circumstances, result in an unreliable electrical connection between the LGA device and the circuit board.

Also, a "quick change" technique such as the one illustrated in FIG. 4 in could be adapted for use with LGA devices. However, because an LGA device is usually socketed and requires compressive forces to activate the socket and establish an electrical connection between a chip and a printed circuit board, a rework adapter used in connection with an LGA device is also subject to compressive forces. Accordingly, an adapter configured for use with an LGA device preferable remains flexible enough to accommodate surface tolerances. Accordingly, the solder joints of a rework path, such as those illustrated in FIG. 4, would be subjected to pressure and relative motion if used in conjunction with an LGA device. Also, because it is difficult to control the amount of solder being deposited, such solder joints may interfere with the LGA socket. Moreover, solder contamination of gold surfaces (such as the gold plated pads of an adapter) may present a problem during the soldering operation. For the forgoing reasons, the elimination of solder from the adapter would be beneficial.

Exemplary embodiments of an adapter and method according to this invention are illustrated in FIGS. 6–10. Referring generally to FIGS. 6–10, an adapter 400 is provided for use with a land grid array (LGA) device 312 that is mounted to a circuit board 314. An interposer socket 328 having a socket body 330 and compliant contacts 332 extending therethrough provides electrical coupling between pads 313 provided on the LGA device 312 and pads 316 provided on the circuit board 314.

Interposer sockets such as socket 328 can be solderless compression connectors such as those that are adapted for use in high-density applications. To provide compliant contacts, they can utilize molybdenum wire formed into a cylindrical omni-directional spring, for example. The compliant contacts can be in the form of a spring alone or a spring in combination with one or more plungers or spacers. The compliant contacts can be positioned in a socket body in the form of a thermoplastic carrier. A wide variety of interposers is contemplated. For examples of interposer sockets, reference can be made to the products provided under the trademark CIN::APSE by Cinch Connectors of Lombard, which is a division of Labinal Components and Systems, Inc.

The adapter 400, which is configured for use with an LGA device, includes a flexible substrate 402 having a conductive layer 403. Vias 404 extend through openings defined in the flexible substrate 402. Conductive pads 410 are electrically connected to the vias 404. Conductive paths (or network traces) 405 extend between adjacent conductive pads 410. Spaces 406 are defined between the conductive paths 405 and the conductive pads 410 to prevent direct contact between the conductive pads 410 and the conductive paths 405. The conductive base layer 403 maintains electrical contact between the conductive pads 410 and the conductive paths 405.

The conductive base layer 403 is preferably a copper layer. Also, the conductive pads and the conductive paths also preferably include a copper layer, and further preferably include a protective layer. The protective layer can include a gold layer and a nickel layer.

The conductive base layer preferably includes about 0.25 oz. copper layer, and the conductive pads and the conductive paths are preferably spaced by about 0.005 inch. The flexible substrate itself should preferably include a flexible dielectic such as a material including a polyimide.

Generally, the adapter 400 is produced by first providing a flexible substrate 402 having a conductive base layer 403. A plurality of vias 404 are formed extending through openings defined in the flexible substrate 402. A plurality of conductive pads 410 are defined on the flexible substrate 402 and are electrically connected to the vias 404. Also, a plurality of conductive paths 405 are defined on the flexible substrate 402 and extend between adjacent conductive pads 410. Spaces 406 are defined between the conductive pads 410 and the conductive paths 405 to prevent direct contact between the conductive pads 410 and the conductive paths 405. The conductive base layer 403 is retained, thereby maintaining electrical contact between the conductive pads 410 and the conductive paths 405.

More specifically, the adapter 400 includes a flexible substrate 402 configured to be positioned adjacent the interposer socket 328. The adapter also includes a plurality of conductors such vias extending through the flexible substrate 402. The conductors each include pads 410 at facing surfaces thereof. The flexible substrate is configured to flex in reaction to forces exerted by the compliant contacts 332 of the interposer socket 328. Contact between the pads 410 adjacent one surface of the flexible substrate 402 with the compliant contacts 332 is thereby facilitated. Also, contact between pads adjacent an opposite surface of the flexible substrate 402 with the pads 316 of the circuit board 314 is facilitated.

Figure 7A:
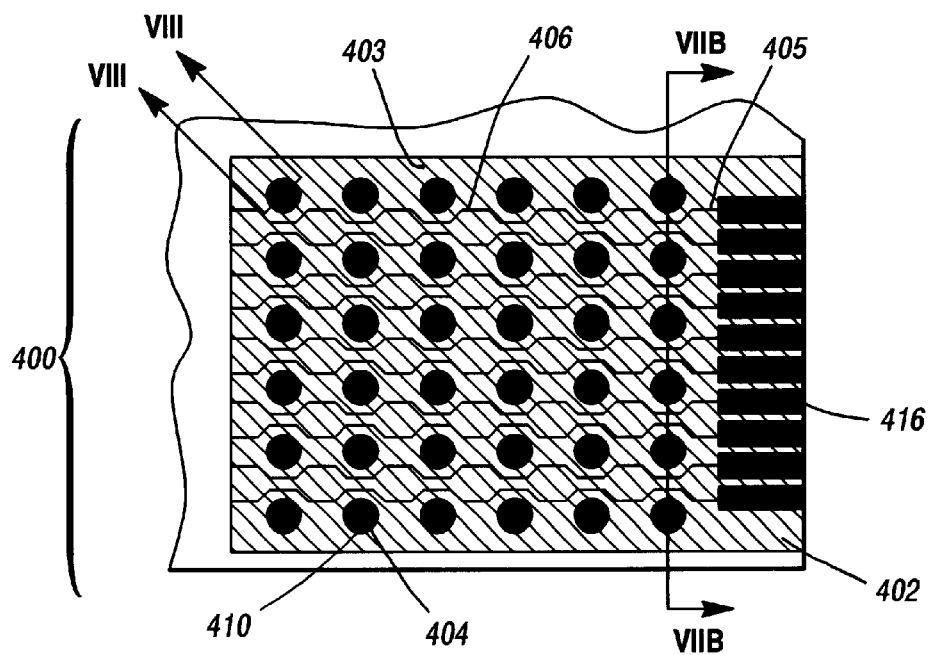
FIG. 7a is a top view of a portion of an exemplary embodiment of an adapter according to this invention.

Although the adapter 400 illustrated in FIGS. 6 and 7a is shown to be interposed between the interposer socket 328 and the circuit board 314 in FIG. 6, it will be appreciated that the adapter according to this invention is alternatively positioned between the interposer socket 328 and the LGA device 312. In other words, the adapter can be positioned adjacent either side of the interposer socket.

Referring now to FIGS. 6 and 7a, change adapter 400 includes a flex circuit 402 through which a plurality of plated vias extend. In other words, plated vias extend through flex circuit 402 from one surface of flex circuit 402 to an opposite surface of flex circuit 402. Each of the plated vias is provided with a pad 410 adjacent opposite surfaces of the flex circuit 402. It will be understood that, in order to facilitate electrical coupling with the vias, pad 410 extends upwardly beyond the surface of flex circuit 402.

In the adapter illustrated in application Ser. No. 09/418,665, a conductor such as a copper trace is provided to extend from one of the plated vias for electrical connection to an external circuit by means of a wire. It is in this manner that a circuit board assembly can be modified in order to carry out an engineering improvement. The adapter illustrated in application Ser. No. 09/418,665 provides an improved modification technique for the implementation of engineering improvements. The adapter according to this invention, however, provides additional capabilities. For example, an adapter according to this invention can be provided as a standard or generic preform that can be purchased for use in engineering laboratories in order to produce a wide variety of adapters to bring about a wide variety of engineering improvements. In other words, the adapter according to this invention is preferably provided without a specific circuit path designed for a specific circuit modification. In contrast, a generic adapter can be purchased for later modification in the engineering laboratory in order to establish a selected circuit path that may be discovered to be necessary to implement an engineering improvement.

The adapter 400, which is preferably in the form of a flex-circuit with a set of plated vias arranged in a pattern corresponding to the LGA device 312, establishes electrical connection as the compliant contacts 332 of interposer socket 328 push on the vias against the pads 316 on the board 314. Alternatively, if the adapter 400 is positioned between the interposer socket 328 and the LGA device 312, the adapter 400 establishes electrical connection between the LGA device and the interposer socket.

The circuit change adapter 400 is preferably designed to match a socket "footprint" including alignment and mounting features. Periphery pads such as pad 416 (shown in FIG. 7) are positioned such that they are accessible after an adapter and a socket are mounted on a printed circuit board. As shown in FIG. 6, a wire 336 may be connected to adapter 400 (for example, at a periphery pad) by means of a soldered connection 338. An opposite end 340 of wire 336 is provided for connection to an external circuit (not shown). Accordingly, it will be appreciated that an adapter according to this invention is a simple and inexpensive flex circuit that can be quickly configured to implement a specific engineering rework, modification, or design improvement.

It has been recognized that the substrate of a circuit board can have surfaces that are not planar. For example, the thickness of the substrate may vary along the length of a substrate or the substrate, even if of constant thickness, may be warped or otherwise deformed prior to assembly of a circuit board or as a result of the assembly process (e.g., due to heat generation or clamps). In some circumstances, such variations in thickness and board deformation can coexist. Additionally, tolerances of the plating of the circuit board's substrate may result in thickness variations.

Figure 7B:
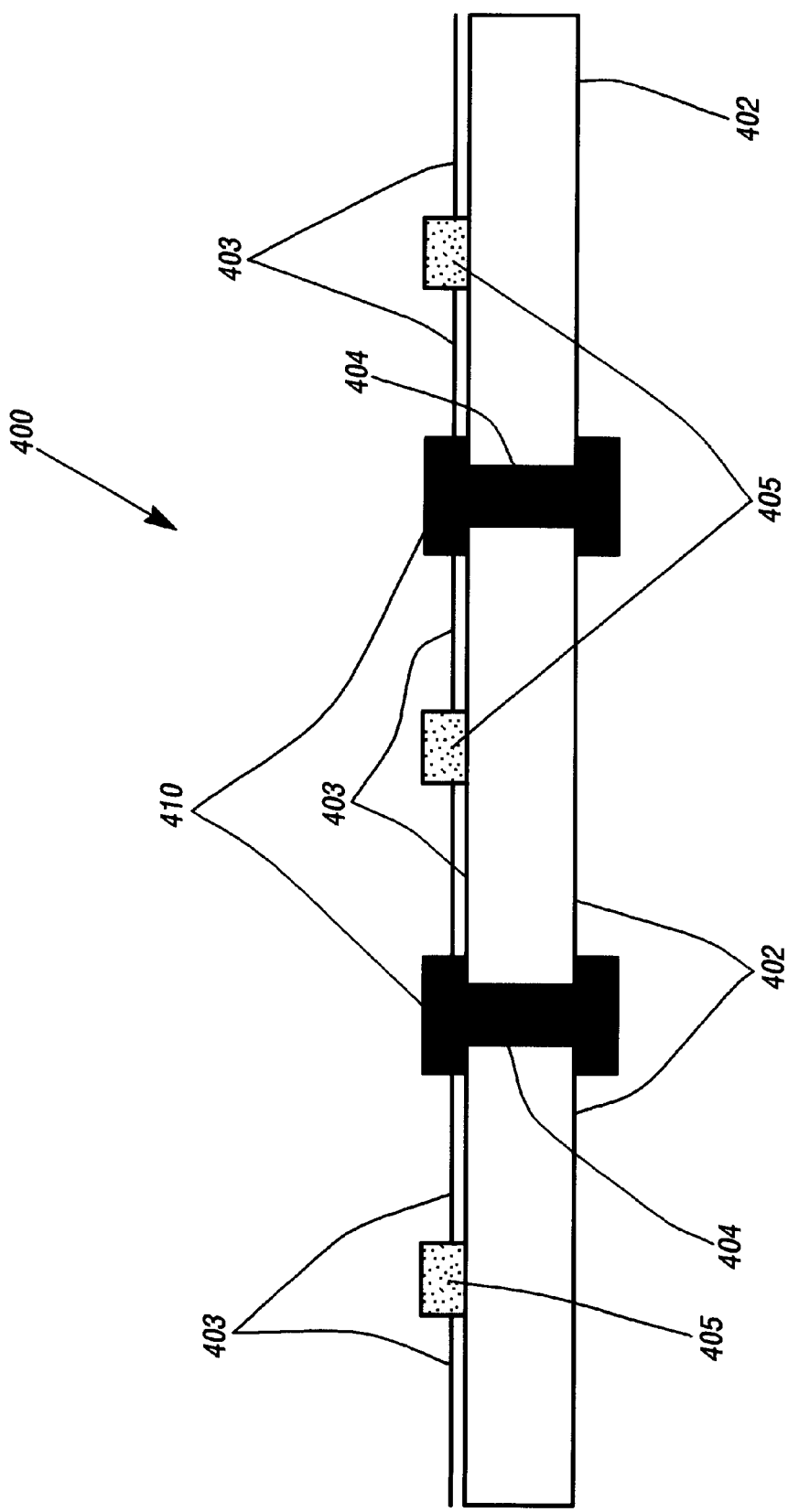
FIG. 7b is a cross-sectional side view of a portion of an adapter according to this invention.

FIG. 7b provides a cross-sectional side view of a portion of an unmodified adapter 400. As such, the etching process used to remove portions of base layer 403 has not been carried out in the embodiment illustrated in FIG. 7b. Vias 404 are included in holes in a flexible substrate 402. Conductive pads 410 are connected to each of the vias 404. Conductors 405 are also included on the flexible substrate 402. The conductive pads 410 and the conductors 405 are not physically in contact with one another. A conductive base layer 403 is included on the surface of the flexible substrate 402. Therefore, although the conductors 405 and the conductive pads 410 are not in physical contact with one another, because of the conductive base layer 403, the conductors 405 and the conductive pads 410 are in electrical contact with one another.

It has been discovered that the flexibility of the substrate used to form an adapter according to this invention compensates for variations in the surface uniformity of a circuit board. In other words, the flexible carrier or substrate of flex circuit 402, in combination with the individually compliant contacts 332 of socket 328, accommodates variations in surface planarity as well as plating tolerances of both an adapter and the printed circuit board.

Figure 8:
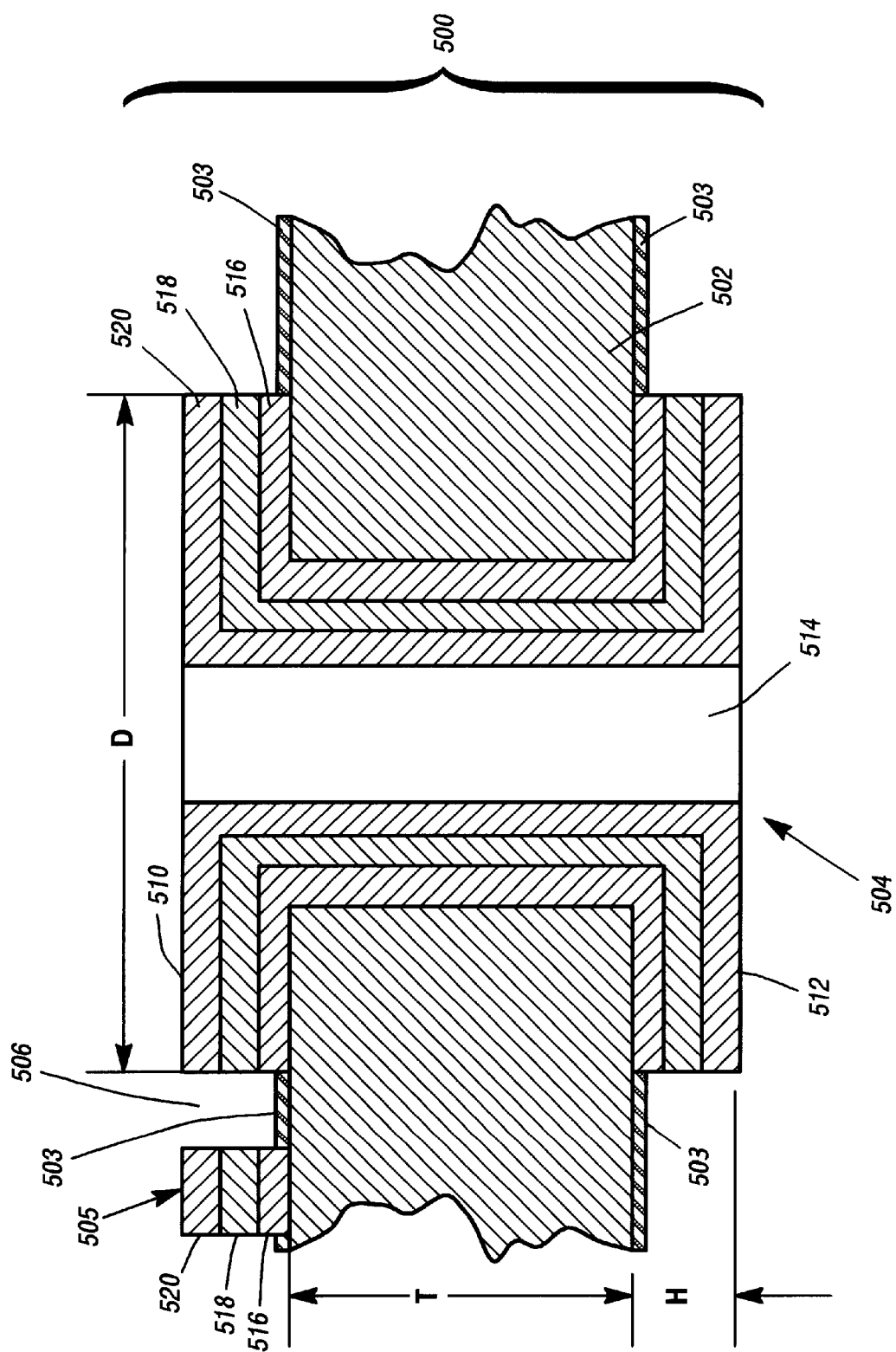
FIG. 8 is a cross-sectional side view of the portion of the adapter illustrated in FIG. 6.

Referring now to FIG. 8, another embodiment of an adapter according to this invention will now be described. An adapter 500 is similar to adapter 400 (FIGS. 6 and 7a) in that adapter 500 includes a flexible substrate 502, which is configured to be positioned adjacent an interposer sockets, and a plurality of conductors 504 (only one shown in FIG. 8) extending through the flexible substrate 502. The conductor 504 includes opposed pads 510 and 512 adjacent facing surfaces 506 and 508 of the flexible substrate 502, respectively.

The conductor 504 of adapter 500 is formed from layers of copper, nickel, and gold. Specifically, as shown in FIG. 8, a hole is formed in flexible substrate 502. A layer of copper 516 extends through the hole and onto surfaces 506 and 508. A layer of nickel 518 extends over the layer of copper 516, and a layer of gold 520 extends over the layer of nickel 518. If one or more of the layers do not fill the hole formed in flexible substrate 502, then a hole 514 will remain.

Pads 510 and 512 of adapter 500 have a diameter "D", and adjacent conductors are preferably positioned so that their centers are at a predetermine distance from one another. For example, if a conductor has pads with a diameter D of 0.030 inch, and adjacent conductors are spaced on 0.050 inch centers, then there will be a gap of 0.020 inch between the edges of the adjacent pads. It is contemplated that a variety of dimensions and patterns could be used for the conductors, depending on the particular application in which adapter 500 is used. Nevertheless, the dimensions and pattern of the conductors preferably match those of the pads of the LGA device and circuit board with which the adapter 500 is intended to be used.

Also, pads 510 and 512 will extend above and below respective facing surfaces 506 and 508 of flexible substrate 502 by a height "H". Height H is preferably selected to enable contact between pads 510 and 512 with adjacent conductors (e.g., pads 313 of LGA device 312, pads 316 of circuit board 314, or compliant contacts 332 of interposer socket 328). Again, a variety of dimensions are contemplated, depending on engineering preferences.

Referring to FIG. 8, adapter 500 also includes conductive paths such as conductive path 505. Like pads 510 and 512, conductive path 505 is formed from layers of copper, nickel, and gold. Specifically, a layer of copper 516 is provided on the surface of the flexible substrate 502. A layer of nickel 518 extends over the layer of copper 516, and a layer of gold 520 extends over the layer of nickel 518. A space 506 is defined between the pads (such as pad 510) and the conductive paths (such as conductive path 505). The spaces 406 from the alternative embodiments are similar in form to spaces 506 in FIG. 8. Referring again to FIG. 8, conductive base, layer 503 extends along opposite surfaces of flexible substrate 502. It will be noted that conductive base layer 503 extends across the space 506 defined between conductive path 505 and conductive pad 510, thereby maintaining electrical contact between the conductive pads and the conductive paths.

Flexible substrate 502 is preferable selected to provide a flex circuit. For example, polyamide film can be used to form flexible substrate 502. Such film is available under the trademark KAPTON from E. I. du Pont de Nemours and Company of Wilmington, Polyester film or other polymeric films or sheets can be substituted. Flexible substrate 502 has a thickness "T" selected so that adapter 500 is configured to flex in reaction to forces exerted by the compliant contacts of the interposer socket.

Although a thickness T of about 0.003 inch may be preferred, a thickness T of about 0.005 inch, about 0.010 inch or greater may be acceptable as well, depending upon the application, components, and planarity of the surfaces with which the adapter will be used. Substrates that are thinner than about 0.003 inch can also be used to provide additional flexibility.

For example, the compliant contacts of an interposer socket each may exert a force of approximately 2 ounces. When used with such an interposer socket, the adapter should be sufficiently flexible to flex in reaction to the contact forces, thereby facilitating contact between the adapter's conductor pads and the interposer socket contacts as well as between the adapter's conductor pads and the LGA device pads or the circuit board pads.

Figure 9:
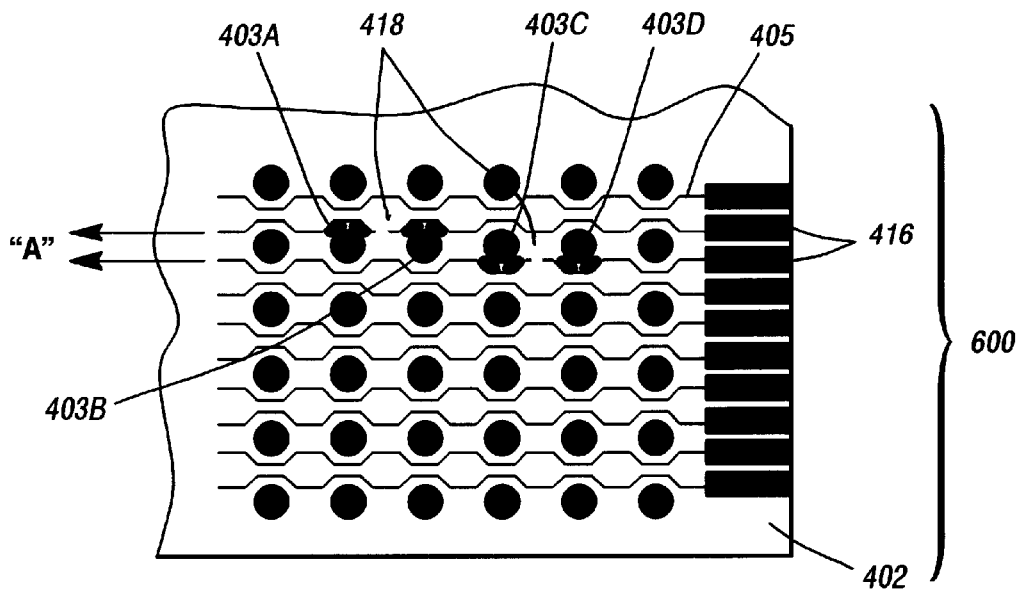
FIG. 9 is a top view of a portion of another embodiment of an adapter according to this invention.
Figure 10:
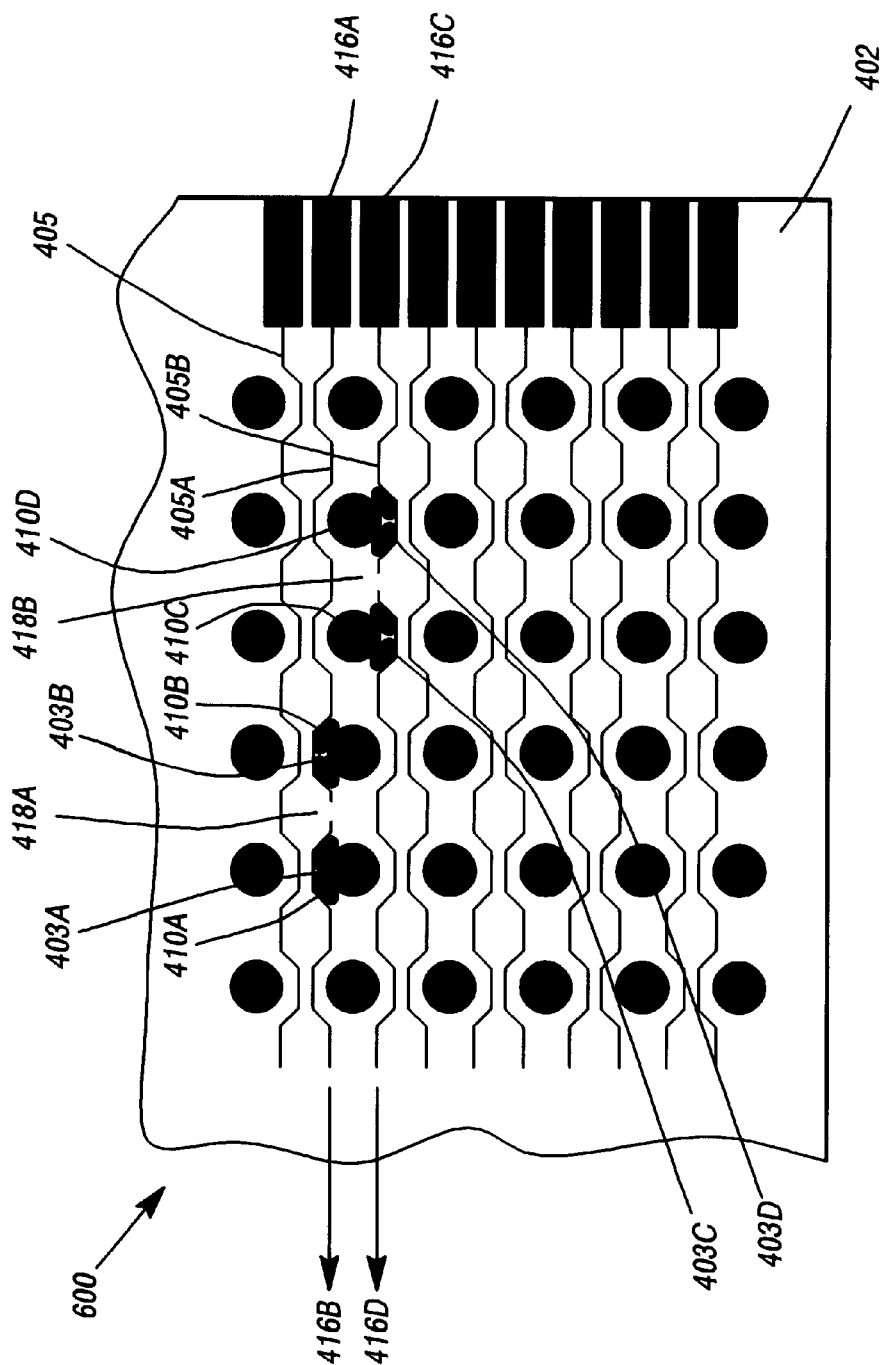
FIG. 10 is a top, close up view of the adapter illustrated in FIG. 9.

A method for reworking a circuit containing an LGA device to provide a desired circuit according to this invention will now be described. Referring to FIGS. 9 and 10, a modified adapter 600 can be produced in the engineering laboratory through modification of a standard adapter such as the adapter 400 shown in FIG. 7a. More specifically, an adapter 400 is provided comprising a flexible substrate 402 having a conductive base layer 403, vias 404 extending through openings defined in the flexible substrate 402, conductive pads 410 electrically connected to the vias 404, and conductive paths 405 extending between adjacent conductive pads 410. Spaces are defined between the conductive paths 405 and the conductive pads 410 of the adapter 400 to prevent direct contact between the conductive pads 410 and the conductive paths 405. The conductive base layer 403 maintains electrical contact between the conductive pads 410 and the conductive paths 405. According to a preferred method of this invention, a desired circuit is selected based on a desired engineering modification to be made to the LGA circuit. A portion of the conductive base layer 403 is removed from the flexible substrate 402 such that the remaining portion of the conductive base layer 403 (base layer traces 403A, 403B, 403C, and 403D shown in FIGS. 9–10), together with selected ones of the conductive pads 410 and conductive paths 405, defines the desired circuit. Base layer traces 403A–403D are illustrated in FIGS. 9–10 by the blackened areas that connect respective conductive pads 410A–410D to conductive paths 405. For example, base layer trace 403A is illustrated as a blackened area that connects conductive pad 410A and an adjacent conductive path. As made clear above in the brief description of the drawings, FIGS. 9–10 provide a view of only a portion of adapter 400. For example, referring to FIG. 9, peripheral pads 416 are provided at the right hand side of adapter 400. Although not shown in FIG. 9, the respective area of the left hand side may be a mirror image of the right hand side. For example, the left hand side also includes peripheral pads 416, as made clear below by reference to FIG. 10.

More specifically, a material such as etch resist is deposited on the conductive base layer 403 to prevent removal of the selected portion of the conductive base layer 403 (base layer traces 403A–403D). The remaining portion of the conductive base layer 403 is then removed by means of an etching procedure.

It will be understood by reference to FIG. 9 that the removal of the conductive base layer 403, except for selected portions of conductive base layer 403 (base layer traces 403A–403D), defines selected circuit traces or paths from selected conductive pads 410 to selected periphery pads 416. Trace cuts 418 (FIG. 9) can be formed in the usual manner (by cutting, for example) in order to remove portions of the conductive paths 405, thereby breaking the connection to an opposite periphery pad such as those indicated by the directional arrow "A" but not shown in FIG. 9.

In the embodiment of modified adapter 600 illustrated in FIG. 9, each row of conductive pads 410 can be utilized to make up to four (4) new circuit connections. Referring specifically to FIG. 10, modified circuit paths are illustrated in connection with a row of conductive pads 410 including conductive pads 410A–410D. The adapter 400 includes conductive paths 405A and 405B. Conductive path 405A extends between periphery pads 416A and 416B (not shown), and conductive path 405B extends between periphery pads 416C and 416D (not shown). Conductive paths 405A and 405B extend adjacent conductive pads 410A–410D, on opposite sides thereof. Spaces are maintained between conductive paths 405A and 405B and conductive pads 410A–410D, but these spaces are bridged electrically by conductive base layer 403 prior to modification of adapter 400.

Four (4) desired circuit paths were selected prior to the formation of modified adapter 600 illustrated in FIG. 10. More specifically, a desired circuit was selected between conductive pad 410A and periphery pad 416B. Also, desired circuits were selected between conductive pad 410B and periphery pad 416A; between conductive pad 410C and periphery pad 416D; and between conductive pad 410D and periphery pad 416C. To prevent undesired circuits (such as between conductive pad 410A and periphery 416A, for example), selected trace cuts 418 are formed in the conductive path 405 (such as selected trace cut 418A in conductive path 405A). Similarly, a trace cut 418B is provided in conductive path 405B to prevent an undesired circuit (such as between conductive pad 410D and periphery pad 416D.

In summary, a preferred embodiment of the rework adapter according to this invention is formed by (1) providing a flexible film; (2) laminating the film with a base layer of copper; (3) drilling via openings through the laminated film; (4) applying resist to the laminated film, except for areas where pads, conductive paths, periphery pads, and vias are desired to be formed; (5) plating the laminated film with copper, nickel and gold layers to form the pads, conductive paths, periphery pads, and vias; and (6) removing the resist. A circuit is then reworked using the adapter preform by (1) applying masking ink to the base lamination at locations where the base lamination is desired to remain to form a circuit; (2) etching the adapter to remove unmasked portions of the base lamination, thereby leaving the desired circuit connection behind; and (3) cutting selected conductive paths to break any undesired circuit paths.

Although this invention has been described with reference to specific embodiments selected for illustration in the drawings, it will be appreciated that a variety of variations and modifications to the illustrated embodiments can be made without departing from the spirit or scope of this invention.

For example, it has been contemplated that a second interposer socket can be interposed between the adapter 400 and the printed circuit board in order to provide compliant contacts for electrical coupling between the conductors of the adapter 400 and the pads 316 of the circuit board 314. Such an assembly using multiple interposer sockets would make it possible to use an adapter formed from a rigid substrate if the interposer sockets are selected to compensate for variations in the planarity of the surfaces of the LGA device, adapters, and circuit board. Nevertheless, the use of an adapter having a flexible substrate is preferred in order to eliminate the expense of providing a second interposer socket and to avoid the change in height required by the use of an additional interposer socket as well as additional fastener hardware for the second interposer socket.

Similarly, more that one adapter can be used—one adjacent the LGA device and one adjacent the circuit board—in order to provide multiple circuit modification or additional space for peripheral contacts at the edge of the adapters. Also, although the adapter may be formed from a flex circuit produced using a variety of materials, the flex circuit is preferably formed from a polymeric film as opposed to rigid glass-fiber reinforced board.

Although the conductive paths have been described with reference to an embodiment that includes undulating paths extending in one general direction across the adapter, it is recognized that a wide variety of conductive paths can be utilized within the scope of this invention. For example, rather than providing conductive paths in the form of a series of substantially parallel lines, a grid of paths can instead be provided so that paths are oriented perpendicular and parallel with respect to one another. Also, the conductive paths need not be in substantially straight lines. They may instead be oriented in squares or other geometric shapes.

Furthermore, it is contemplated that the array of conductive pads can be defined into sections (such as four (4) quadrants), and the conductive paths may delineate such portions. In one alternative embodiment, the array of pads can be divided into four (4) quadrants, and the conductive paths in a quadrant can run parallel to the boundaries with the adjacent quadrant. Each of such conductive pads could extend adjacent one another without crossing over one another. Also each such conductive path can extend from a periphery pad on one edge of the adapter, take a 90 degree turn, and extend toward a periphery pad on an adjacent edge of the adapter.

Additional modifications can be made without departing from the scope of this invention, which is defined separately in the appended claims.

What is claimed:

1. An adapter for use with an LGA device, said adapter comprising:

a flexible insulative substrate having a conductive base layer, said conductive base layer substantially covering a surface of said flexible substrate;

vias extending through openings defined in said flexible substrate;

conductive pads electrically connected to said vias; and conductors extending between adjacent conductive pads, spaces being defined between said conductors and said conductive pads to prevent direct contact between said conductive pads and said conductors, said conductive base layer maintaining electrical contact between said conductive pads and said conductors, wherein said conductive base layer is configured to be selectively removed such that at least one remaining portion electrically couples at least one of said conductive pads to one of said conductors.

2. The adapter recited in claim 1, said conductive base layer comprising a copper layer.

3. The adapter recited in claim 1, said conductive pads and said conductive paths comprising a copper layer.

4. The adapter recited in claim 3, said conductive pads and said conductive paths further comprising a protective layer on said copper layer.

5. The adapter recited in claim 4, said protective layer comprising a gold layer.

6. The adapter recited in claim 5, said protective layer further comprising a nickel layer.

7. The adapter recited in claim 1, said conductive base layer comprising about a 0.25 oz. copper layer.

8. The adapter recited in claim 1, said conductive paths and said conductive pads being spaced by about 0.005 inch.

9. The adapter recited in claim 1, said flexible substrate comprising a flexible dielectric material.

10. The adapter recited in claim 9, said flexible dielectric material comprising a polyimide.

11. An adapter for use with an LGA device, said adapter comprising:

a flexible insulative substrate having a conductive base layer;

vias extending through openings defined in said flexible substrate;

conductive pads electrically connected to said vias;

a plurality of peripheral pads on said flexible substrate; and a plurality of conductive paths extending between adjacent conductive pads such that spaces are defined between said conductive paths and said conductive pads to prevent direct contact between said conductive pads and said conductive paths, each of said conductive paths connected to at least one of said peripheral pads, said conductive base layer substantially covering a surface of said flexible insulative substrate and maintaining electrical contact between said conductive pads and said conductive paths, wherein said conductive base layer is configured to be selectively removed such that at least one remaining portion electrically couples at least one of said conductive pads to one of said conductive paths.

12. An adapter for use with an LGA device, said adapter comprising:

a flexible insulative substrate having a conductive base layer;

vias extending through openings defined in said flexible substrate;

conductive pads electrically connected to said vias;

a plurality of peripheral pads on said flexible substrate; and a plurality of conductive paths extending between adjacent conductive pads such that spaces are defined between said conductive paths and said conductive pads to prevent direct contact between said conductive pads and said conductive paths, each of said conductive paths being connected to at least two of said peripheral pads, said conductive base layer substantially covering a surface of said flexible insulative substrate and maintaining electrical contact between said conductive pads and said conductive paths, wherein said conductive base layer is configured to be selectively removed such that at least one remaining portion electrically couples at least one of said conductive pads to one of said conductive paths.

* * * * *